(12) United States Patent
Jang et al.

(10) Patent No.: US 8,304,900 B2
(45) Date of Patent: Nov. 6, 2012

(54) INTEGRATED CIRCUIT PACKAGING SYSTEM WITH STACKED LEAD AND METHOD OF MANUFACTURE THEREOF

(75) Inventors: Ki Youn Jang, Ichon-si (KR); YoungJoon Kim, Ichon-si (KR); JoHyun Bae, Seoul (KR)

(73) Assignee: Stats Chippac Ltd., Singapore (SG)

( * ) Notice: Subject to any disclaimer, the term of this patent is extended or adjusted under 35 U.S.C. 154(b) by 87 days.

(21) Appl. No.: 12/854,306

(22) Filed: Aug. 11, 2010

(65) Prior Publication Data

US 2012/0038040 A1  Feb. 16, 2012

(51) Int. Cl.
  *H01L 23/12*  (2006.01)
(52) U.S. Cl. ........ 257/733; 257/775; 257/779; 257/780; 257/E23.015
(58) Field of Classification Search .................. 257/733, 257/775, 779, 780
See application file for complete search history.

(56) References Cited

U.S. PATENT DOCUMENTS

| | | | |
|---|---|---|---|
| 6,031,292 A * | 2/2000 | Murakami et al. | 257/778 |
| 7,144,538 B2 * | 12/2006 | Lee et al. | 264/272.11 |
| 7,148,576 B2 | 12/2006 | Nemoto | |
| 7,345,361 B2 | 3/2008 | Mallik et al. | |
| 7,378,734 B2 | 5/2008 | Yabuki et al. | |
| 7,608,921 B2 | 10/2009 | Pendse | |
| 2006/0189033 A1 * | 8/2006 | Kim | 438/109 |
| 2008/0111233 A1 | 5/2008 | Pendse | |
| 2009/0026609 A1 | 1/2009 | Masuda | |
| 2009/0303690 A1 | 12/2009 | Lee et al. | |
| 2010/0007002 A1 | 1/2010 | Pendse | |
| 2010/0171205 A1 | 7/2010 | Chen et al. | |
| 2010/0171207 A1 | 7/2010 | Shen et al. | |

* cited by examiner

*Primary Examiner* — Wai Sing Louie
(74) *Attorney, Agent, or Firm* — Ishimaru & Associates LLP; Mikio Ishimaru; Stanley M. Chang

(57) ABSTRACT

A method of manufacture of an integrated circuit packaging system includes: providing a substrate; attaching an integrated circuit device to the substrate; forming a stud interconnect having stacked studs, the stud interconnect on the substrate and having a contact surface and a crown surface on an end of the stud interconnect opposite the substrate; applying an encapsulation over the integrated circuit die, over the stud interconnect, and over the substrate; and forming a cavity in the encapsulation over the stud interconnect, the contact surface and the crown surface exposed in the cavity.

20 Claims, 5 Drawing Sheets

US 8,304,900 B2

INTEGRATED CIRCUIT PACKAGING SYSTEM WITH STACKED LEAD AND METHOD OF MANUFACTURE THEREOF

TECHNICAL FIELD

The present invention relates generally to an integrated circuit packaging system, and more particularly to a system for leads.

BACKGROUND ART

Semiconductor chips have become progressively more complex, driven in large part by the need for increasing processing power in a smaller chip size for compact or portable electronic devices such as cell phones, smart phones, personal media systems, ultraportable computers.

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps or other suitable electrical connections.

In general, the die and portions of the leadframe are encapsulated with a molding material to protect the delicate electrical components on the active side of the die while leaving selected portions of the leadframe exposed to facilitate electrical connection to external devices.

In response to the smaller chip size, packaging technologies have evolved, for example, to enable an increased lead density, which can reduce the footprint area of a package mounted on a printed circuit board (PCB). Some packaging technologies may enable this increased lead density by providing rows of leads connected to a disposable portion of a leadframe.

However, manufacturing processes for such leadframes may not be scalable. As lead density requirements further increase, it may be desirable to use packaging technologies that are more scalable in terms of lead density.

Moreover, it may be desirable to reduce package size and package costs in additional ways. At the same time, it may be desirable to maintain sufficient structural integrity and to facilitate surface mounting of the package to a PCB. It may also be desirable to formulate a packaging process designed to meet these objectives while providing increases in package reliability and reductions in packaging defects. Current packaging solutions can meet some of these objectives but may not be able to meet most, or all, of these objectives.

Thus, a need remains for increased density and structural integrity. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; attaching an integrated circuit device to the substrate; forming a stud interconnect having stacked studs, the stud interconnect on the substrate and having a contact surface and a crown surface on an end of the stud interconnect opposite the substrate; applying an encapsulation over the integrated circuit die, over the stud interconnect, and over the substrate; and forming a cavity in the encapsulation over the stud interconnect, the contact surface and the crown surface exposed in the cavity.

The present invention provides an integrated circuit packaging system, including: a substrate; an integrated circuit device attached to the substrate; a stud interconnect having stacked studs, the stud interconnect on the substrate and having a contact surface and a crown surface on an end of the stud interconnect opposite the substrate; an encapsulation over the integrated circuit die, over the stud interconnect, and over the substrate; and a cavity in the encapsulation over the stud interconnect, the contact surface and the crown surface exposed in the cavity.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
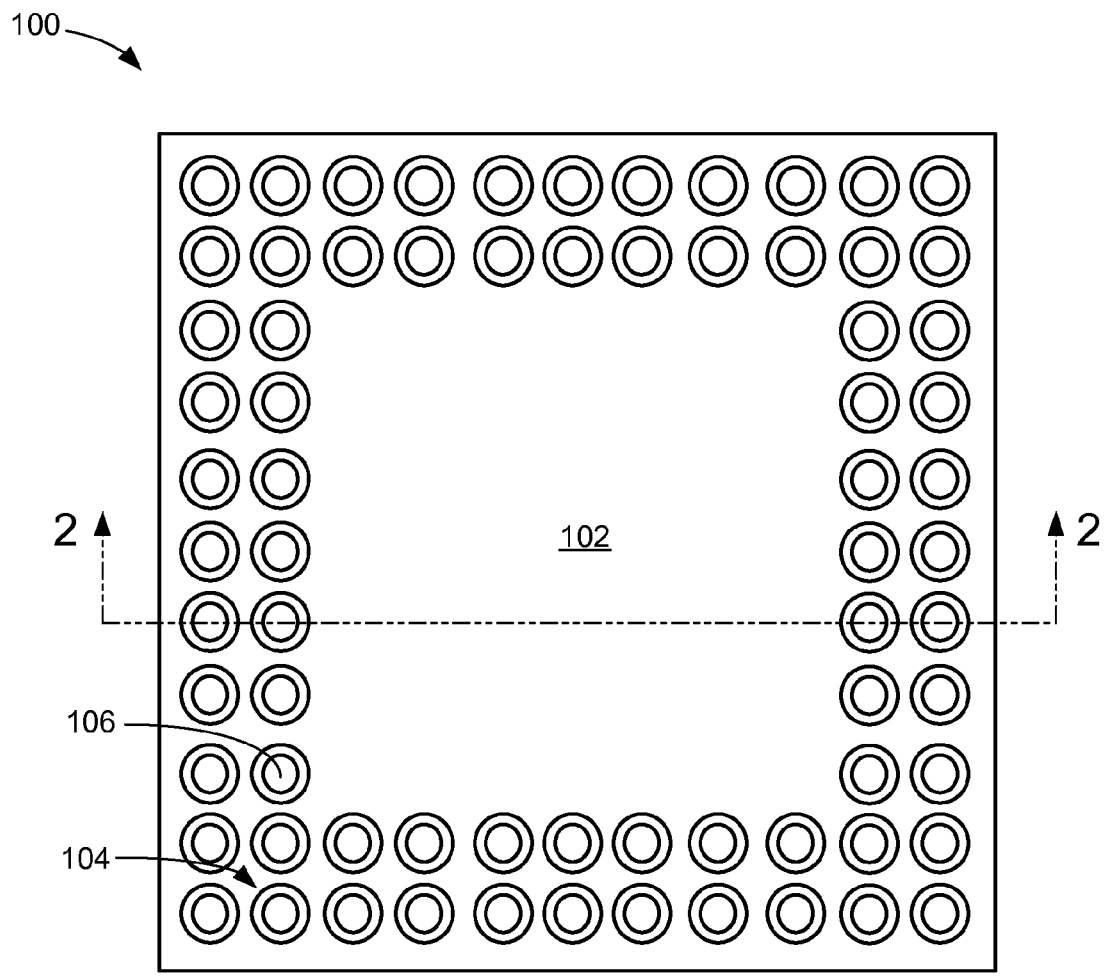
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 is shown with an encapsulation 102 having cavities 104 and a contact surface 106 exposed from within each of the cavities 104. The contact surface 106 provides connectivity between the integrated circuit packaging system 100 and a next level of integration (not shown) such as external circuitry, an integrated circuit package, an integrated circuit module, discrete electrical devices, or a combination thereof.

The encapsulation 102 is used to protect the integrated circuit packaging system 100 by providing structural support and to hermetically seal the contents of the integrated circuit packaging system 100. Two rows of the cavities 104 in the encapsulation 102 can be formed along a periphery of the integrated circuit packaging system 100 although it is understood that any number of rows may be used.

Figure 2:
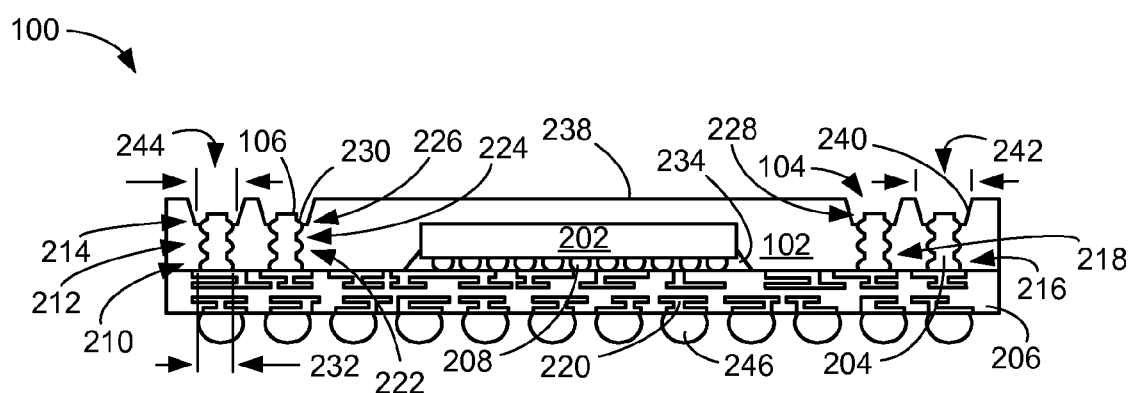
FIG. 2 is a cross-sectional view of FIG. 1 taken along a line 2-2 of FIG. 1.

Referring now to FIG. 2, therein is shown a cross-sectional view of FIG. 1 taken along a line 2-2 of FIG. 1. The integrated circuit packaging system 100 includes an integrated circuit device 202, stud interconnects 204, a substrate 206, conductive connectors 208, and the encapsulation 102. The stud interconnects 204 provide connectivity between the integrated circuit packaging system 100 and the next level of integration (not shown).

The stud interconnects 204 are formed or constructed of a conductive material that includes a wire or a metal conductor. For example, the stud interconnects 204 can preferably be formed using a wire bonding process that can include using wire bonding equipment as opposed to solder printing, masking, etc. The conductive material is absent of any dependencies of or requirements for a flux material, also referred to as flux. For example, conductors formed of solder require a flux material for connection to other materials or preformed solder. The flux material is defined as a chemical or chemicals applied to or contained in a material to prevent oxidation and reduce surface tension of the material during a formation or an assembly of the material particularly at an elevated temperature.

It has been discovered that the formation of the stud interconnects 204 without the need for flux material significantly reduces manufacturing steps that can include re-flowing, de-fluxing, and pre-baking processes.

It has also been discovered that the stud interconnects 204 can be formed having a pitch significantly smaller than a typical package formed with solder based package interconnects.

Each of the stud interconnects 204 includes a stud base 210, a stud extension 212, and a stud riser 214. The stud base 210 includes a base portion 216 and a neck portion 218 over the base portion 216. The base portion 216 can have a profile shape of a torus. The neck portion 218 can have a profile shape of a column.

The base portion 216 is attached to substrate conductors 220 on the substrate 206. The substrate conductors 220 can provide electrical connectivity between and within sides of the substrate 206.

The stud extension 212 includes an extension base portion 222 and an extension neck portion 224. The extension base portion 222 and the extension neck portion 224 can be formed in a manner similar to the base portion 216 and the neck portion 218 of the stud base 210, respectively. The extension base portion 222 is over the neck portion 218 and joined or abutted to the neck portion 218.

The stud riser 214 includes a riser base portion 226 and an exposed riser neck portion 228. The riser base portion 226 and the exposed riser neck portion 228 can be formed in a manner similar to the extension base portion 222 and the extension neck portion 224 of the stud extension 212, respectively. The riser base portion 226 is over the extension neck portion 224 and joined or abutted to the extension neck portion 224.

The contact surface 106 is located on an end of the exposed riser neck portion 228 over and facing away from the substrate 206. A crown surface 230 of the riser base portion 226 formed below, surrounding, and intersecting the exposed riser neck portion 228 can be exposed from within the cavities 104 of the encapsulation 102. The crown surface 230 and the contact surface 106 closest to an end of the stud interconnects 204 furthest away from the substrate 206.

It has been discovered that the crown surface 230 of the stud interconnects 204 can improved product yield and reliability by providing a surface area for contact test probes to probe and thoroughly test the package to improve yield while ensuring that the contact surface 106 is pristine and without marks for reliable connectivity to the next level of integration.

For illustrative purposes, the stud interconnects 204 are shown having the stud base 210, the stud extension 212, and the stud riser 214. It is understood that the stud interconnects 204 can be implemented and configured differently.

For example, the stud interconnects 204 could include an another of the stud extension 212 connecting the stud extension 212 with the stud riser 214. In yet another example, the stud extension 212 and the stud riser 214 can be omitted from the stud interconnects 204 resulting a portion of the stud base 210 exposed from the encapsulation 102. Each of the stud interconnects 204 can have any number of stacked studs that include the stud base 210, the stud extension 212, the stud riser 214, or a combination thereof.

Base diameters 232 of the base portion 216, the extension base portion 222, and the riser base portion 226 of the stud interconnects 204 are each greater than a diameter of any horizontal cross-section of the neck portion 218, the extension neck portion 224, and the exposed riser neck portion 228. The base diameters 232 are defined as a maximum diameter measured at horizontal cross-sections of the base portion 216, the extension base portion 222, and the riser base portion 226, respectively.

The integrated circuit device 202 or a flip chip, can be attached and connected to a side of the substrate 206 having the stud interconnects 204 using the conductive connectors 208. The conductive connectors 208 can include solder, wires, or any combination thereof.

An underfill 234 can be applied between the integrated circuit device 202 and the substrate 206 to surround and protect the conductive connectors 208 during assembly of the integrated circuit packaging system 100. The encapsulation 102 can be applied over the integrated circuit device 202, the substrate 206, and around the stud interconnects 204 with the crown surface 230 and the exposed riser neck portion 228 exposed from the encapsulation 102. A top surface 238 of the encapsulation 102 is formed over the integrated circuit device 202 and facing away from the substrate 206.

The cavities 104 are formed with non-vertical sides 240 of the encapsulation 102. The non-vertical sides 240 intersect the top surface 238 and form a cavity opening having an upper width 242 greater than a lower width 244 at an end of the cavities 104 opposite the cavity opening. The base diameters 232 are less than the lower width 244 of the cavities 104.

Package connectors 246 can optionally be attached or connected to the substrate conductors 220 on a side of the substrate 206 opposite or facing away from the encapsulation 102. The package connectors 246 can be used to provide connectivity to the substrate 206 and circuitry within the integrated circuit packaging system 100.

Figure 3:
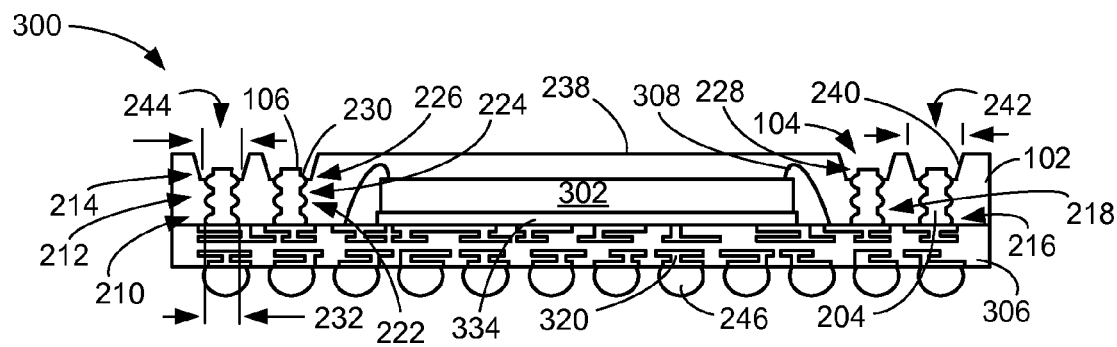
FIG. 3 is a cross-sectional view of an integrated circuit packaging system in a second embodiment of the present invention.

Referring now to FIG. 3, therein is shown a cross-sectional view of an integrated circuit packaging system 300 in a second embodiment of the present invention. The integrated circuit packaging system 300 can be similar to the integrated circuit packaging system 100 except the integrated circuit packaging system 300 includes an integrated circuit device 302, a substrate 306, and conductive connectors 308.

The stud interconnects 204 provide connectivity between the integrated circuit packaging system 300 and the next level of integration (not shown). Each of the stud interconnects 204 are include the stud base 210, the stud extension 212, and the stud riser 214. The stud base 210 includes the base portion 216 and the neck portion 218 over the base portion 216. The stud interconnects 204 can be formed using a wire bonding process that can include using wire bonding equipment as opposed to solder printing, masking, etc.

It has been discovered that the formation of the stud interconnects 204 without the need for flux material significantly reduces manufacturing steps that can include re-flowing, de-fluxing, and pre-baking processes.

It has also been discovered that the stud interconnects 204 can be formed having a pitch significantly smaller than a typical package formed with solder based package interconnects.

The base portion 216 of the stud base 210 is attached to substrate conductors 320 on the substrate 306. The substrate conductors 320 can provide electrical connectivity between and within sides of the substrate 306.

The neck portion 218 of the stud base 210 is joined or abutted to the extension base portion 222 of the stud extension 212. The riser base portion 226 of the stud riser 214 is joined or abutted to the extension neck portion 224 of the stud extension 212.

The contact surface 106 is located on an end of the exposed riser neck portion 228 over and facing away from the substrate 306. The crown surface 230 of the riser base portion 226 formed below, surrounding, and intersecting the exposed riser neck portion 228 can be exposed from within the cavities 104 of the encapsulation 102.

It has been discovered that the crown surface 230 of the stud interconnects 204 can improved product yield and reliability by providing a surface area for contact test probes to probe and thoroughly test the package to improve yield while ensuring that the contact surface 106 is pristine and without marks for reliable connectivity to the next level of integration.

For illustrative purposes, the stud interconnects 204 are shown having the stud base 210, the stud extension 212, and the stud riser 214. It is understood that the stud interconnects 204 can be implemented and configured differently. For example, the stud interconnects 204 could include an another of the stud extension 212 connecting the stud extension 212 with the stud riser 214. In yet another example, the stud extension 212 and the stud riser 214 can be omitted from the stud interconnects 204 resulting a portion of the stud base 210 exposed from the encapsulation 102.

The base diameters 232 of the base portion 216, the extension base portion 222, and the riser base portion 226 of the stud interconnects 204 are each greater than a diameter of any horizontal cross-section of the neck portion 218, the extension neck portion 224, and the exposed riser neck portion 228.

The integrated circuit device 302 or a wire bond chip, can be connected to a side of the substrate 306 having the stud interconnects 204 using the conductive connectors 308. The conductive connectors 308 can include wires, solder, or any combination thereof.

An adhesive layer 334 can be used to attach the integrated circuit device 302 to the substrate 306. The adhesive layer 334 can include glue, an adhesive film, or any material suitable for mounting electronic components. The encapsulation 102 can be applied over the integrated circuit device 302, the substrate 306, and around the stud interconnects 204 with the crown surface 230 and the exposed riser neck portion 228 exposed from the encapsulation 102. The top surface 238 of the encapsulation 102 is formed above and facing away from the substrate 306.

The cavities 104 are formed with the non-vertical sides 240 of the encapsulation 102. The upper width 242 of the cavity opening is greater than the lower width 244 of the cavities 104 opposite the cavity opening. The base diameters 232 are less than the lower width 244 of the cavities 104.

The package connectors 246 can optionally be attached or connected to the substrate conductors 320 on a side of the substrate 306 opposite or facing away from the encapsulation 102. The package connectors 246 can be used to provide connectivity to the substrate 306 and circuitry within the integrated circuit packaging system 300.

Figure 4:
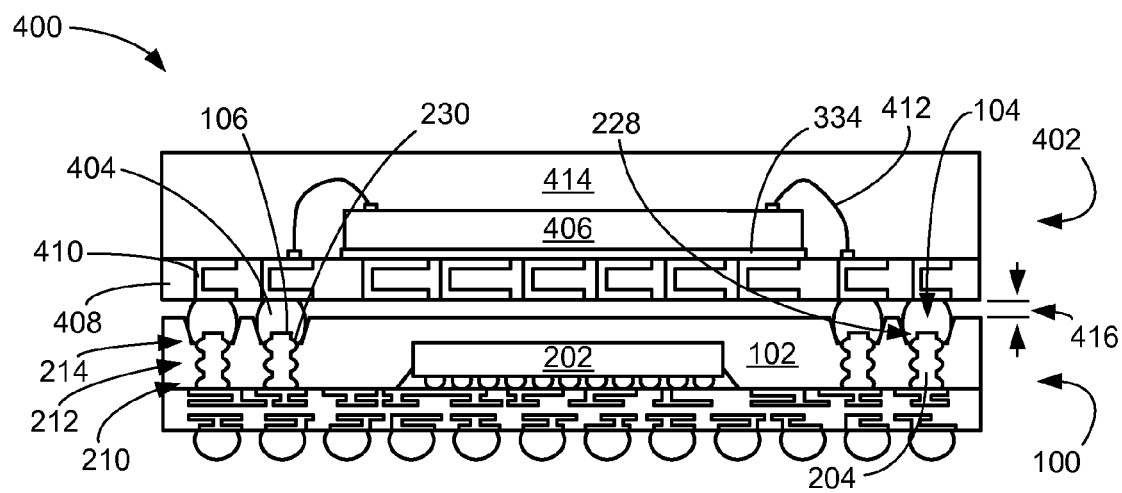
FIG. 4 is a cross-sectional view of an integrated circuit packaging system in a third embodiment of the present invention.

Referring now to FIG. 4, therein is shown a cross-sectional view of an integrated circuit packaging system 400 in a third embodiment of the present invention. The integrated circuit packaging system 400 includes an integrated circuit package 402, stack interconnectors 404, and the integrated circuit packaging system 100.

The integrated circuit package 402 can include a flip chip 406 mounted on a package substrate 408 using the adhesive layer 334. Package substrate conductors 410 on sides and within the package substrate 408 can provide connectivity on and between sides of the package substrate 408.

Wire bond wires 412 can be used to attach circuitry of the flip chip 406 to the package substrate conductors 410 on a side of the package substrate 408. The flip chip 406, the wire bond wires 412, and the side of the package substrate 408 with the flip chip 406 can be covered with a package encapsulant 414 similar to the encapsulation 102.

The stack interconnectors 404, formed from conductive materials such as solder, metals, metal alloys, or a combination thereof, can be used to connect the integrated circuit package 402 with the integrated circuit packaging system 100. An upper portion of the stack interconnectors 404 can be attached to the package substrate conductors 410 on a side of the package substrate 408 opposite the side of the package substrate 408 having the flip chip 406 of the integrated circuit package 402.

A lower portion of the stack interconnectors 404 can be attached directly on the contact surface 106, the crown surface 230, or a combination thereof of the stud interconnects 204 exposed from the encapsulation 102 of the integrated circuit packaging system 100. The lower portion of the stack interconnectors 404 can fill the cavities 104 of the encapsulation 102 and conform to the non-vertical sides 240 of FIG. 2.

The stack interconnectors 404 can provide a standoff height 416 between the integrated circuit package 402 and the integrated circuit packaging system 100. The standoff height 416 is defined a distance separating and preventing direct contact of the package substrate 408 of the integrated circuit package 402 with the top surface 238 of the integrated circuit packaging system 100.

For illustrative purposes, the stud interconnects 204 are shown attached directly to the stack interconnectors 404 having an elliptical cross-sectional shape. It is understood that the stud interconnects 204 can be attach to the stack interconnectors 404 with different cross-sectional shapes. For example, the contact surface 106 of the stud interconnects 204 can be directly attached to the stack interconnectors 404 formed having a cross-sectional shape of a needle or pin.

It has been discovered that the contact surface 106 of the stud interconnects 204 enables the stud interconnects 204 to be directly attached on to different types of the stack interconnectors 404 having different cross-sectional shapes, sizes, and pitches.

Figure 5:
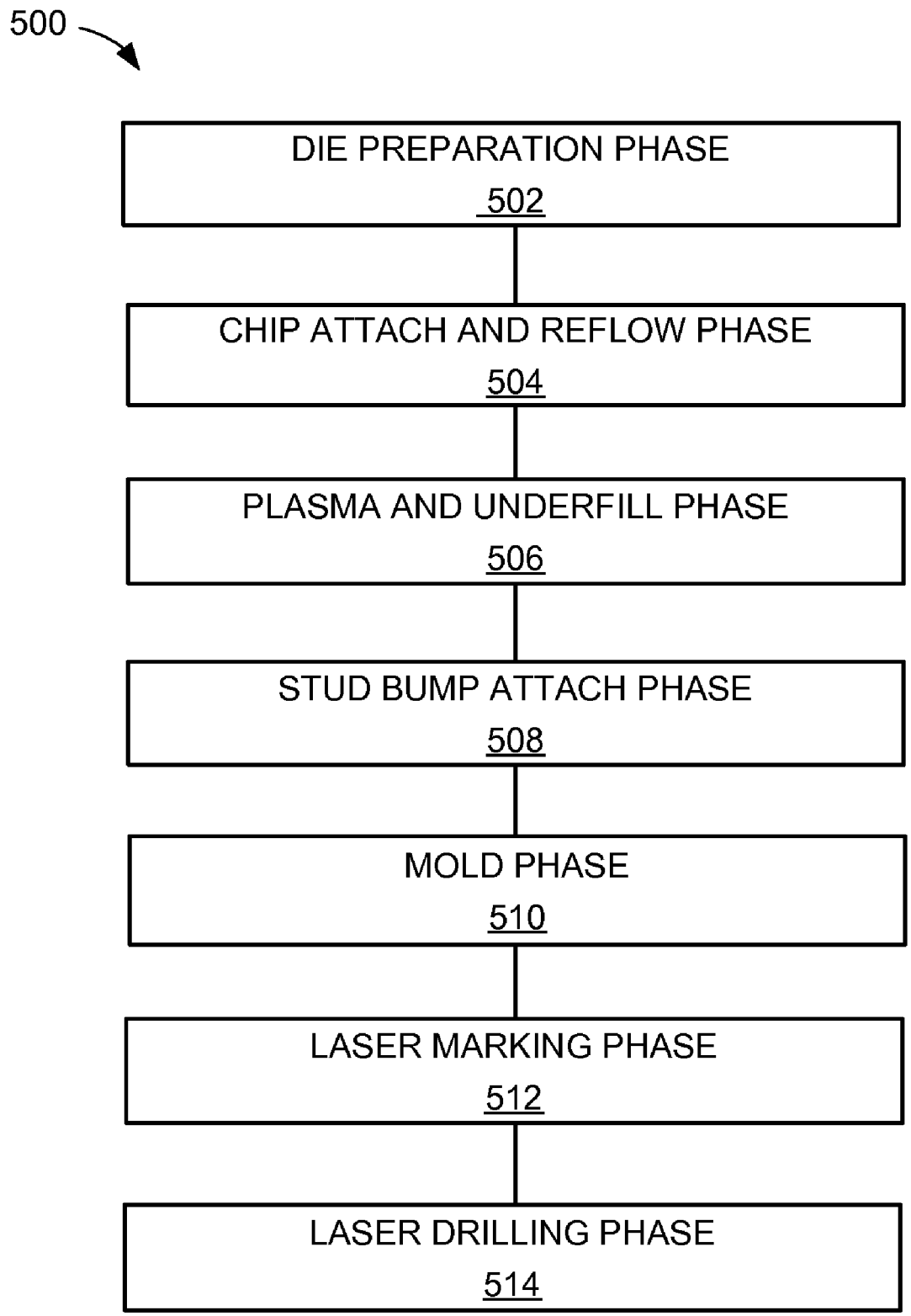
FIG. 5 is a process flow diagram of manufacturing phases of the integrated circuit packaging system of FIG. 2.

Referring now to FIG. 5, therein is shown a process flow diagram of manufacturing phases of the integrated circuit packaging system 100 of FIG. 2. The manufacturing of the integrated circuit packaging system 100 can include a die preparation phase 502, a chip attach and reflow phase 504, a plasma and underfill phase 506, a stud bump attach phase 508, a mold phase 510, a laser marking phase 512, and a laser drilling phase 514.

The die preparation phase 502 includes a preparation process to shape and condition the integrated circuit device 202 of FIG. 2 from a base wafer (not shown). The preparation process can include manufacturing processes such as back grinding, sawing, cleaning, or any combination thereof.

The integrated circuit device 202 can be attached and connected to the substrate 206 of FIG. 2 during the chip attach and reflow phase 504. The chip attach and reflow phase 504 uses an attachment and reflow process that can include cleaning of the integrated circuit device 202, cleaning and masking of the substrate 206, placement of solder and flux, and reflow of the solder to attach and connect the integrated circuit device 202 to the substrate 206.

The plasma and underfill phase 506 can be used to provide additional protection to the solder between the integrated circuit device 202 and the substrate 206 as well as the integrated circuit device 202 and the substrate 206. The plasma and underfill phase 506 uses a plasma and underfill process that can include plasma cleaning to remove flux and excess mask material, drying of surfaces between the integrated circuit device 202 and the substrate 206, and application and curing of underfill material within a controlled environment.

The stud bump attach phase 508 can be used to form and attach the stud interconnects 204 of FIG. 2 to the substrate conductors 220 of FIG. 2 on the substrate 206 using a wire bonding process that can include using wire bonding equipment as opposed to solder printing, masking, etc. The wire bonding process can include forming the stud base 210 of FIG. 2 over the substrate conductors 220 using a thin wire and a wire bond or wire weld process, a controlled feed process of the thin wire, a controlled drawn of the thin wire, and a temperature controlled environment.

The stud extension 212 of FIG. 2 and the stud riser 214 of FIG. 2 can be formed in a manner similar to the stud base 210. The stud riser 214 can be separated from the thin wire using a separation and finishing process that can include cutting, cooling, polishing, and plating.

It has been discovered that the stud interconnects 204 increases production throughput of the integrated circuit packaging system 100 by elimination of a reflow process, a flux removal process, and a pre-bake process from the manufacturing processes of package on package stackable packages.

It has also been discovered that the stud interconnects 204 can be formed having a pitch smaller than a pitch of a typical package on package interconnect formed using solder material.

The mold phase 510 can be used to cover and form the encapsulation 102 of FIG. 2 over the integrated circuit device 202, the substrate 206, and the stud interconnects 204, using a molding process. The molding process can include a mold compound, a controlled heating environment, a mold chase attach, a mold chase removal, and a controlled cooling environment.

The laser marking phase 512 can be used to generate reference indicators on the top surface 238 to locate positions of the encapsulation 102 that are directly over the stud interconnects 204 using a laser marking process. The laser marking process can include a laser to mark, triangulate, align, and form fiducial marks on or in the top surface 238 of FIG. 2 of the substrate 206.

The laser drilling phase 514 can be used to remove portions of the encapsulation 102 through the top surface 238 to expose the contact surface 106 of FIG. 2 and the crown surface 230 of FIG. 2 using a laser drilling process. The laser drilling process can include a laser configured to pulse drill, percussion drill, or contour and feather edge the encapsulation 102 at different angles to form the cavities 104 of FIG. 2 exposing the contact surface 106 and the crown surface 230 of the stud interconnects 204.

Figure 6:
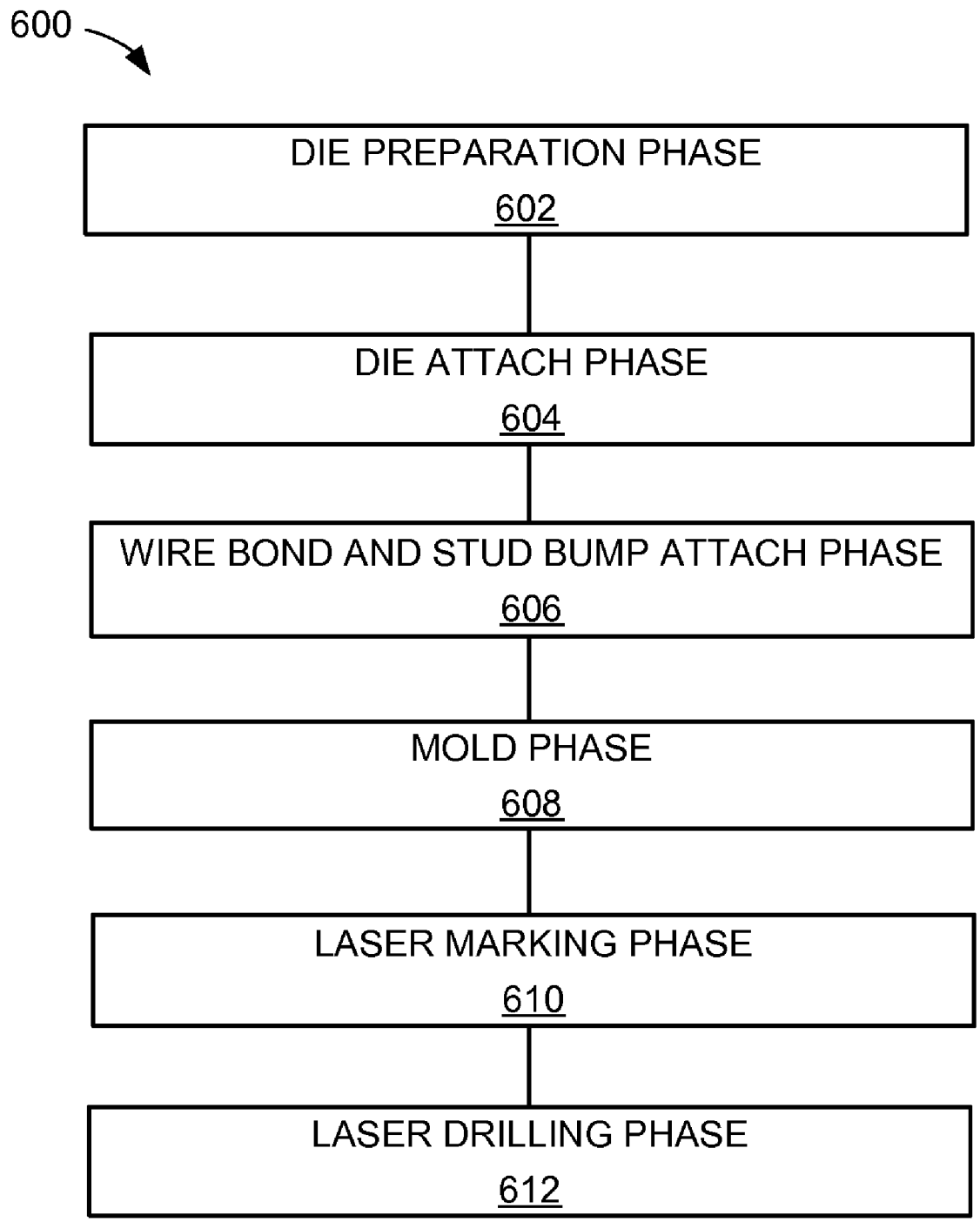
FIG. 6 is a process flow diagram of manufacturing phases of the integrated circuit packaging system of FIG. 3.

Referring now to FIG. 6, therein is shown a process flow diagram of manufacturing phases of the integrated circuit packaging system 300 of FIG. 3. The manufacturing of the integrated circuit packaging system 300 can include a die preparation phase 602, a die attach phase 604, a wire bond and stud bump attach phase 606, a mold phase 608, a laser marking phase 610, and a laser drilling phase 612.

The die preparation phase 602 includes a preparation process to shape and condition the integrated circuit device 302 of FIG. 3 from a base wafer (not shown). The preparation process can include manufacturing processes such as back grinding, sawing, cleaning, or any combination thereof.

The integrated circuit device 302 can be mounted to the substrate 306 of FIG. 3 during the die attach phase 604. The die attach phase 604 uses a die attach process that can include positioning the integrated circuit device 302 over the substrate 306 of FIG. 3 and attaching the integrated circuit device 302 to the substrate 306 using the adhesive layer 334 of FIG. 3.

The wire bond and stud bump attach phase 606 can be used to form and attach the stud interconnects 204 of FIG. 3 to the substrate conductors 320 of FIG. 3 on the substrate 306 using the wire bonding process that can include using wire bonding equipment as opposed to solder printing, masking, etc. The wire bonding process can be used to attach ends of the conductive connectors 308 of FIG. 3 to circuitry of the integrated circuit device 302 and to the substrate conductors on the substrate 306.

It has been discovered that the stud interconnects 204 significantly improves the reliability of the integrated circuit packaging system 300 by minimizing thermal stress and warpage of the substrate 306.

It has also been discovered that the stud interconnects 204 and attachment of the wire bond wires can be performed simultaneously resulting in reductions in manufacturing processing times and an increase in manufacturing throughput.

The mold phase 608 can be used to cover and form the encapsulation 102 of FIG. 3 over the integrated circuit device 302, the substrate 306, and the stud interconnects 204, using a molding process. The molding process can include a mold compound, a controlled heating environment, a mold chase attach, a mold chase removal, and a controlled cooling environment.

The laser marking phase 610 can be used to generate reference indicators on the top surface 238 to locate positions of the encapsulation 102 that are directly over the stud interconnects 204 using a laser marking process. The laser marking process can include a laser to mark, triangulate, align, and form fiducial marks on or in the top surface 238 of FIG. 3 of the substrate 306.

The laser drilling phase 612 can be used to remove portions of the encapsulation 102 through the top surface 238 to expose the contact surface 106 of FIG. 3 and the crown surface 230 of FIG. 3 using a laser drilling process. The laser drilling process can include a laser configured to pulse drill, percussion drill, or contour and feather edge the encapsulation 102 at different angles to form the cavities 104 of FIG. 3 exposing the contact surface 106 and the crown surface 230 of the stud interconnects 204.

Figure 7:
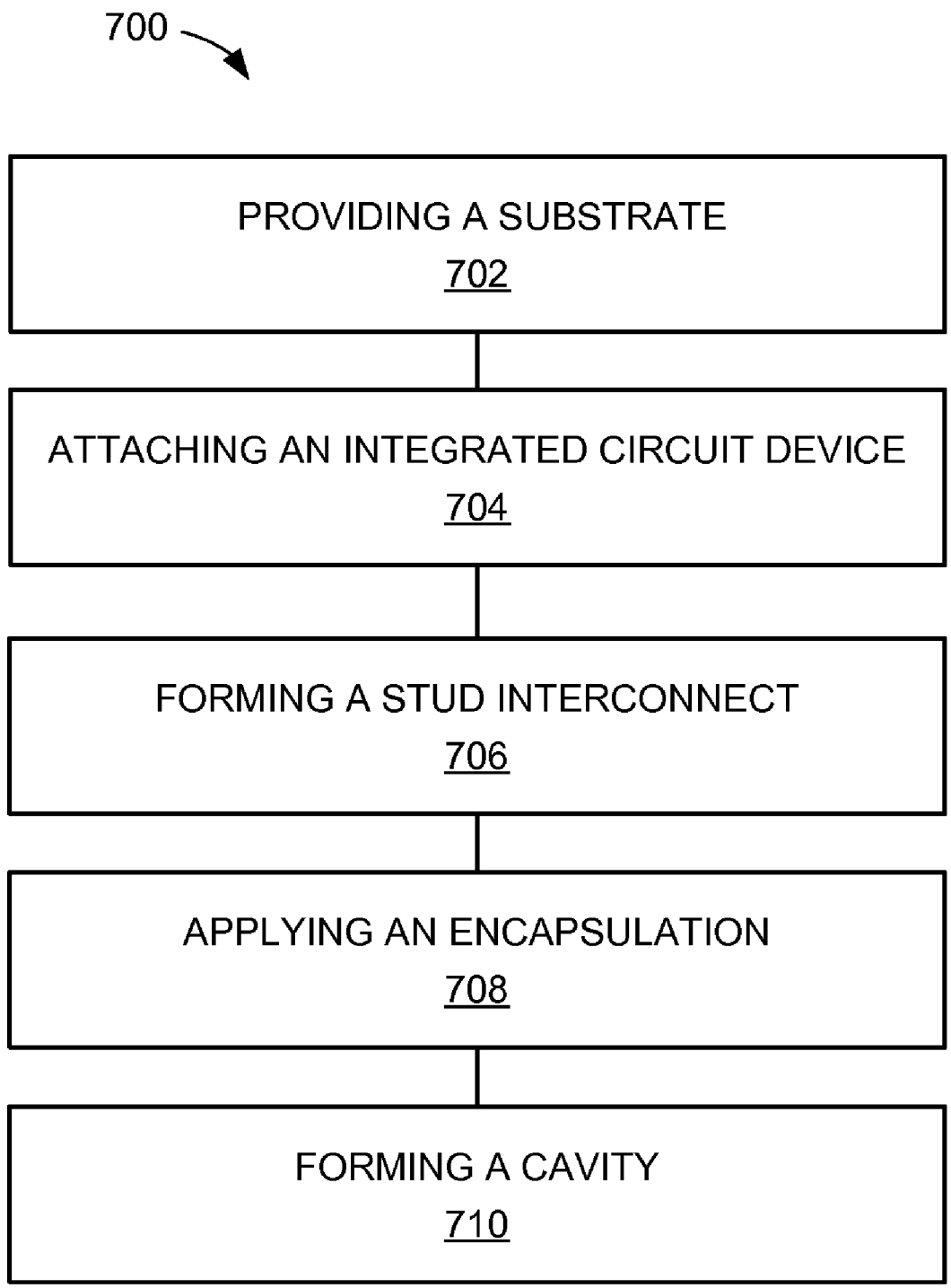
FIG. 7 is a flow chart of a method of manufacture of the integrated circuit packaging system in a further embodiment of the present invention.

Referring now to FIG. 7, therein is shown is a flow chart of a method 700 of manufacture of the integrated circuit packaging system 100 in a further embodiment of the present invention. The method 700 includes: providing a substrate in a block 702; attaching an integrated circuit device to the substrate in a block 704; forming a stud interconnect having stacked studs, the stud interconnect on the substrate and having a contact surface and a crown surface on an end of the stud interconnect opposite the substrate in a block 706; applying an encapsulation over the integrated circuit die, over the stud interconnect, and over the substrate in a block 708; and forming a cavity in the encapsulation over the stud interconnect, the contact surface and the crown surface exposed in the cavity in a block 710.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    providing a substrate;
    attaching an integrated circuit device to the substrate;
    forming a stud interconnect having stacked studs, the stud interconnect on the substrate and having a contact surface and a crown surface on an end of the stud interconnect opposite the substrate;
    applying an encapsulation over the integrated circuit die, over the stud interconnect, and over the substrate; and
    forming a cavity in the encapsulation over the stud interconnect, the contact surface and the crown surface exposed in the cavity.

2. The method as claimed in claim 1 wherein forming the cavity includes forming the cavity with a non-vertical side of the encapsulation.

3. The method as claimed in claim 1 wherein forming the stud interconnect includes forming a stud base of the stud interconnect on the substrate.

4. The method as claimed in claim 1 further comprising connecting another integrated circuit package to the crown surface.

5. The method as claimed in claim 1 further comprising attaching a package connector to a side of the substrate facing away from the encapsulation.

6. A method of manufacture of an integrated circuit packaging system comprising:
    providing a substrate;
    attaching an integrated circuit device to the substrate;
    forming a stud interconnect having stacked studs, the stud interconnect on the substrate and having a contact surface and a crown surface on an end of the stud interconnect opposite the substrate;
    applying an encapsulation over the integrated circuit die, over the stud interconnect, and over the substrate;
    forming a cavity in the encapsulation over the stud interconnect, the contact surface and the crown surface exposed in the cavity; and
    connecting a package connector to a side of the substrate opposite the encapsulation.

7. The method as claimed in claim 6 wherein forming the cavity in the encapsulation includes forming the cavity having an upper width greater than a lower width.

8. The method as claimed in claim 6 wherein forming the stud interconnect includes attaching the stud interconnect to a substrate conductor of the substrate.

9. The method as claimed in claim 6 further comprising connecting an integrated circuit package to the contact surface.

10. The method as claimed in claim 6 wherein connecting the package connector includes attaching the package connector to a substrate conductor on a side of the substrate opposite the encapsulation.

11. An integrated circuit packaging system comprising:
a substrate;
an integrated circuit device attached to the substrate;
a stud interconnect having stacked studs, the stud interconnect on the substrate and having a contact surface and a crown surface on an end of the stud interconnect opposite the substrate; and
an encapsulation over the integrated circuit die, over the stud interconnect, and over the substrate, and the encapsulation having a cavity over the stud interconnect with the contact surface and the crown surface exposed in the cavity.

12. The system as claimed in claim 11 wherein the cavity includes the cavity formed with a non-vertical side of the encapsulation.

13. The system as claimed in claim 11 wherein the stud interconnect includes a stud base of the stud interconnect formed on the substrate.

14. The system as claimed in claim 11 further comprising another integrated circuit package connected to the crown surface.

15. The system as claimed in claim 11 further comprising a package connector connected to a side of the substrate facing away from the encapsulation.

16. The system as claimed in claim 11 further comprising a package connector connected to a side of the substrate opposite the encapsulation.

17. The system as claimed in claim 16 wherein the cavity includes having an upper width greater than a lower width.

18. The system as claimed in claim 16 wherein the stud interconnect includes the stud interconnect attached to a substrate conductor of the substrate.

19. The system as claimed in claim 16 further comprising an integrated circuit package connected to the contact surface.

20. The system as claimed in claim 16 wherein the package connector includes the package connector attached to a substrate conductor on a side of the substrate exposed from the encapsulation.

* * * * *